United States Patent
Feng et al.

(10) Patent No.: US 10,319,942 B2
(45) Date of Patent: Jun. 11, 2019

(54) OLED DEVICE, PACKAGING METHOD THEREOF, AND PACKAGING APPARATUS

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventors: Xiang Feng, Beijing (CN); Tao Wang, Beijing (CN); Yun Qiu, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 0 days.

(21) Appl. No.: 15/321,347

(22) PCT Filed: Apr. 17, 2015

(86) PCT No.: PCT/CN2015/076835
§ 371 (c)(1),
(2) Date: Dec. 22, 2016

(87) PCT Pub. No.: WO2016/112595
PCT Pub. Date: Jul. 21, 2016

(65) Prior Publication Data
US 2017/0213998 A1    Jul. 27, 2017

(30) Foreign Application Priority Data

Jan. 15, 2015  (CN) .......................... 2015 1 0020578

(51) Int. Cl.
*H01L 21/02*       (2006.01)
*H01L 21/283*      (2006.01)
(Continued)

(52) U.S. Cl.
CPC ............ *H01L 51/5253* (2013.01); *B32B 7/12* (2013.01); *B32B 9/04* (2013.01); *B32B 9/041* (2013.01);
(Continued)

(58) Field of Classification Search
CPC .. B01D 67/0058; B01D 69/10; B01D 71/021; B01D 67/0053; B01D 67/0069;
(Continued)

(56) References Cited

U.S. PATENT DOCUMENTS

2012/0258311 A1*  10/2012  Hong .................... B82Y 30/00
                                                    428/408
2013/0059155 A1*  3/2013  Choi ..................... B82Y 30/00
                                                    428/408
(Continued)

FOREIGN PATENT DOCUMENTS

CN    101436648 A    5/2009
CN    102592964 A    7/2012
(Continued)

OTHER PUBLICATIONS

International Search Report dated Jun. 23, 2015 issued in corresponding International Application No. PCT/CN2015/076835.
(Continued)

*Primary Examiner* — Brian Turner
(74) *Attorney, Agent, or Firm* — Nath, Goldberg & Meyer; Joshua B. Goldberg (57) ABSTRACT

The present invention provides an OLED device, and a packaging method thereof and a packaging apparatus. The packaging method is for packaging an OLED device formed on a base substrate, and includes: separating a graphene thin film formed on a copper foil from the copper foil; and packaging the OLED device using the graphene thin film. In the packaging method, the graphene thin film is introduced (Continued)

into packaging of an OLED device, thereby not only improving packaging effect of the OLED device, but also simplifying packaging process of the OLED device and increasing production efficiency.

19 Claims, 3 Drawing Sheets

(51) Int. Cl.
| | |
|---|---|
| B32B 37/02 | (2006.01) |
| H05K 1/05 | (2006.01) |
| B44C 1/165 | (2006.01) |
| H01L 51/52 | (2006.01) |
| H01L 51/56 | (2006.01) |
| B32B 7/12 | (2006.01) |
| B32B 9/04 | (2006.01) |
| B32B 27/06 | (2006.01) |
| B32B 27/28 | (2006.01) |
| B32B 27/30 | (2006.01) |
| B32B 27/32 | (2006.01) |
| B32B 27/36 | (2006.01) |
| B32B 27/38 | (2006.01) |
| B32B 27/40 | (2006.01) |
| B32B 27/42 | (2006.01) |

(52) U.S. Cl.
CPC .............. *B32B 9/045* (2013.01); *B32B 27/06* (2013.01); *B32B 27/28* (2013.01); *B32B 27/283* (2013.01); *B32B 27/302* (2013.01); *B32B 27/304* (2013.01); *B32B 27/32* (2013.01); *B32B 27/36* (2013.01); *B32B 27/365* (2013.01); *B32B 27/38* (2013.01); *B32B 27/40* (2013.01); *B32B 27/42* (2013.01); *H01L 51/56* (2013.01); *B32B 2255/00* (2013.01); *B32B 2255/20* (2013.01); *B32B 2255/24* (2013.01); *B32B 2255/26* (2013.01); *B32B 2255/28* (2013.01); *B32B 2270/00* (2013.01); *B32B 2307/546* (2013.01); *B32B 2307/7244* (2013.01); *B32B 2307/7265* (2013.01); *B32B 2307/748* (2013.01); *B32B 2457/206* (2013.01); *B32B 2553/00* (2013.01); *H01L 2251/301* (2013.01)

(58) Field of Classification Search
CPC ......... B32B 37/02; B32B 38/10; B32B 37/24; B32B 37/12; B32B 9/007; H01L 21/187; H01L 29/1606
See application file for complete search history.

(56) References Cited

U.S. PATENT DOCUMENTS

| | | | | |
|---|---|---|---|---|
| 2014/0162433 A1* | 6/2014 | Willner | ............... | H01L 21/0201 438/458 |
| 2014/0212760 A1* | 7/2014 | Zhao | ..................... | H01M 4/583 429/231.8 |
| 2014/0231270 A1* | 8/2014 | Loh | .......................... | C25F 5/00 205/674 |
| 2014/0238873 A1* | 8/2014 | Li | ............................. | C25F 5/00 205/644 |
| 2015/0064470 A1* | 3/2015 | Kimura | .................. | B32B 37/02 428/408 |
| 2015/0151528 A1* | 6/2015 | Shimizu | ................. | B32B 37/12 428/408 |
| 2015/0217219 A1* | 8/2015 | Sinsabaugh | ........ | B01D 67/0058 210/489 |
| 2016/0027935 A1* | 1/2016 | Naito | ................... | H01L 31/1884 438/98 |
| 2016/0181553 A1* | 6/2016 | Huang | ................ | H01L 51/0097 428/141 |
| 2017/0318625 A1* | 11/2017 | Bouchiat | ................ | H05B 3/145 |

FOREIGN PATENT DOCUMENTS

| | | |
|---|---|---|
| CN | 102807208 A | 12/2012 |
| CN | 103342472 A | 10/2013 |
| CN | 103682054 A | 3/2014 |
| CN | 103692743 A | 4/2014 |
| CN | 103922327 A | 7/2014 |
| KR | 10-2012-0133279 A | 12/2012 |
| KR | 10-2014-0012557 A | 2/2014 |
| WO | 2012/050443 A1 | 4/2012 |

OTHER PUBLICATIONS

Office Action dated May 4, 2016 issued in corresponding Chinese Application No. 201510020578.8.
Office Action dated Oct. 18, 2016 issued in corresponding Chinese Application No. 201510020578.8.
Extended European Search Report (EESR) dated Jul. 25, 2018 in corresponding European Patent Application No. 15877513.0.

* cited by examiner

OLED DEVICE, PACKAGING METHOD THEREOF, AND PACKAGING APPARATUS

CROSS-REFERENCE TO RELATED APPLICATION

This is a National Phase Application filed under 35 U.S.C. 371 as a national stage of PCT/CN2015/076835 filed on Apr. 17, 2015, an application claiming the benefit of Chinese application no. 201510020578.8 filed on Jan. 15, 2015, the content of each of which is hereby incorporated by reference in its entirety.

TECHNICAL FIELD

The present invention relates to the field of display technology, and particularly relates to an OLED device, and a packaging method thereof and a packaging apparatus.

BACKGROUND

Along with the continuous development of organic electro-luminescence (OLED) technology, as well as continuous evolution of OLED devices, packaging method and packaging level of OLED device have always been the key topics discussed in the industry.

Since water and oxygen are natural enemies of organic materials, they can not only break an unsaturated bond of a polymer to accelerate aging of an organic material, but also cause damage to electrodes in a device. The packaging level of an OLED device determines both lifespan and environmental dependence of the device.

UV glue packaging is a common packaging method of an OLED device in laboratories, and has low cost and simple operations, but UV glue may contact the device during UV curing, producing a bad influence on the device, making the device fail to be applied to the actual industry. Frit packaging is a packaging method that uses glass powder for curing so that a packaging glass and a substrate bond together, and is a comparatively mature packaging method in the industry. A disadvantage of this method is that curing effect of glass powder cannot be controlled, and a crack may occur during the glass powder curing, which may affect packaging effect, and air may enter the device through the crack, affecting lifespan of the device. In view of the disadvantage of Frit packaging, thin film packaging, in which an OLED device is packaged by preparing an organic-inorganic alternating multilayer thin film on a surface of the cathode of the OLED device, starts to show its advantage, but packaging process of this method is too complicated and immature and has low productivity.

SUMMARY

To address the above technical problem existing in the prior art, embodiments of the present invention provide an OLED device, a packaging method thereof, and a packaging apparatus. In the packaging method, a graphene thin film is introduced into packaging of an OLED device, so that characteristics such as high transmittance, ultra-thinness, flexibility, high water and oxygen resistance, and ease of transfer between substrates (i.e. ease of separation from a copper foil and connection to an OLED device) of the graphene thin film can be sufficiently utilized, thereby not only improving packaging effect of the OLED device, but also simplifying packaging process of the OLED device and increasing production efficiency.

An embodiment of the present invention provides a packaging method for packaging an OLED device formed on a base substrate, the method including: separating a graphene thin film formed on a copper foil from the copper foil; and packaging the OLED device using the graphene thin film.

In an embodiment, the method for separating a graphene thin film formed on a copper foil from the copper foil and packaging the OLED device using the graphene thin film may include: step S10 of adhering a surface of the copper foil on which no graphene thin film is formed to a fixing substrate by a double-sided adhesive; step S11 of processing a viscous polymer into a fluid state and pouring the fluid state viscous polymer onto a surface of the copper foil on which the graphene thin film is formed; step S12 of gluing the viscous polymer with an adhesive tape after curing the viscous polymer, and then stripping a composite film formed of the graphene thin film and the viscous polymer from the copper foil; step S13 of forming a passivation layer on the OLED device, coating a transparent adhesive on the passivation layer, and adhering a surface of the graphene thin film of the composite film to the transparent adhesive before curing the transparent adhesive; and step S14 of curing the transparent adhesive.

In the step S11, the viscous polymer may be processed into a fluid state by employing a melting method.

The fixing substrate may be made of glass, quartz or silicon wafer material.

In an embodiment, the method for separating a graphene thin film formed on a copper foil from the copper foil and packaging the OLED device using the graphene thin film may include: step S20 of forming a passivation layer on the OLED device, and coating a transparent adhesive on the passivation layer; step S21 of adhering a surface of the copper foil on which the graphene thin film is formed to the transparent adhesive before curing the transparent adhesive; step S22 of curing the transparent adhesive; and step S23 of fixing the base substrate subjected to step S22, gluing a surface of the copper foil on which no graphene thin film is formed by using an adhesive tape, and separating the copper foil from the graphene thin film.

In an embodiment, the method for separating a graphene thin film formed on a copper foil from the copper foil and packaging the OLED device using the graphene thin film may include: step S30 of forming a passivation layer on the OLED device; step S31 of attaching a surface of the copper foil on which no graphene thin film is formed to a roller able to be heated; step S32 of fixing the base substrate subjected to step S30 onto a base table, with the OLED device facing away from the base table; step S33 of dripping a transparent adhesive on a first side of the OLED device on the base substrate such that a side edge of the graphene thin film on the roller corresponds to and contacts with the transparent adhesive; step S34 of heating the roller to cause the transparent adhesive to be in a incompletely cured state, rolling the roller to a second side of the OLED device opposite to the first side so that the transparent adhesive is coated on the passivation layer after being dragged by the roller, the passivation layer is adhered to the graphene thin film by the transparent adhesive, and at the same time the copper foil is separated from the graphene thin film; and step S35 of curing the transparent adhesive.

A size of the graphene thin film may be greater than a size of the OLED device, and the graphene thin film may entirely cover the OLED device.

The transparent adhesive may be made of the same material as the viscous polymer. The viscous polymer may include any one or more of polyethylene terephthalate, polydimethylsiloxane, polypropylene, epoxy resin type polyethylene, ABS plastic, polyvinyl chloride, polyformaldehyde, polycarbonate, phenolic plastic, polyurethane plastic, epoxy resin, unsaturated polyester plastic, furan plastic, organic silicon resin, and propylene based resin.

A curing temperature of the transparent adhesive may be lower than or equal to a critical temperature of heat treatment of the OLED device.

After separating the copper foil from the graphene thin film, the method may further include forming a protection layer on the graphene thin film.

The protection layer may be formed by using solution spin coating or chemical vapor deposition. The protection layer may be made of a transparent organic insulating material or a transparent inorganic insulating material.

In the step S32, the base substrate subjected to step S30 may be fixed onto the base table by an adhering method or a vacuum absorption method.

The passivation layer may be formed by using low temperature chemical vapor deposition (LTPECVD), atomic layer deposition (ALD) or room temperature bonding (RTB). A temperature at which the passivation layer is deposited by using the low temperature chemical vapor deposition may be lower than or equal to a critical temperature of heat treatment of the OLED device. The passivation layer may be made of silicon nitride, silicon dioxide, aluminum oxide, or silicon oxynitride.

An embodiment of the present invention further provides an OLED device, which is packaged using the packaging method described above.

An embodiment of the present invention further provides a packaging apparatus for packaging an OLED device formed on a base substrate, including a packaging mechanism used for separating a graphene thin film formed on a copper foil from the copper foil and packaging the OLED device using the graphene thin film.

The packaging apparatus may further include a base table used for supporting the base substrate and the OLED device, and the base substrate is attached onto a supporting surface of the base table.

The packaging mechanism may include a cylindrical roller, a driving part and a heating part, a cylindrical surface of the roller is used for attaching the copper foil on which the graphene thin film is formed, and a surface of the copper foil on which no graphene thin film is formed is attached to the cylindrical surface of the roller. The roller is provided above the base table, and a starting position for rolling the roller corresponds to a first side of the OLED device on the base substrate, and a gap for accommodating a transparent adhesive is formed between the roller and the base substrate. The heating part is provided inside the roller, and is used for heating the cylindrical surface of the roller such that the transparent adhesive is in an incompletely cured state. The driving part is connected to an end part of the roller, and is used for driving the roller to roll to a second side of the OLED device opposite to the first side, and the rolling roller can drag the transparent adhesive to extend along the rolling direction of the roller.

An axial direction of the roller may be parallel to a side edge of the base substrate corresponding to the first side of the OLED device, and a length of the roller may be greater than or equal to that of the side edge of the base substrate.

In the packaging method provided by embodiments of the present invention, a graphene thin film is introduced into packaging of an OLED device by separating a graphene thin film formed on a copper foil from the copper foil and packaging the OLED device using the graphene thin film, so that characteristics such as high transmittance, ultra-thinness, flexibility, high water and oxygen resistance, and ease of transfer between substrates (i.e. ease of separation from a copper foil and connection to an OLED device) of the graphene thin film can be sufficiently utilized, thereby not only improving packaging effect of the OLED device, but also simplifying packaging process of the OLED device and increasing production efficiency.

The OLED device provided by embodiments of the present invention has better packaging effect by being packaged using the above packaging method, thereby improving quality and lifespan of the OLED device.

In the packaging apparatus provided by embodiments of the present invention, by providing the packaging mechanism, speedy and convenient separation of the graphene thin film from the copper foil can be realized, and at the same time the OLED device can be packaged by the graphene thin film, thereby not only improving packaging effect of the OLED device, but also simplifying packaging process of the OLED device and increasing production efficiency.

DETAILED DESCRIPTION

In order to provide a better understanding of the technical solutions of the present invention to those skilled in the art, an OLED device, a packaging method thereof and a packaging apparatus provided by the invention are described in further detail below in conjunction with the drawings and specific implementations.

First Embodiment

The present embodiment provides a packaging method for packaging an OLED device formed on a base substrate, and the method includes: separating a graphene thin film formed on a copper foil from the copper foil; and packaging the OLED device using the graphene thin film.

In the packaging method, a graphene thin film is introduced into packaging of an OLED device, so that characteristics such as high transmittance, ultra-thinness, flexibility, high water and oxygen resistance, and ease of transfer between substrates (i.e. ease of separation from a copper foil and connection to an OLED device) of the graphene thin film can be sufficiently utilized, thereby not only improving packaging effect of the OLED device, but also simplifying packaging process of the OLED device and increasing production efficiency.

Figure 1:
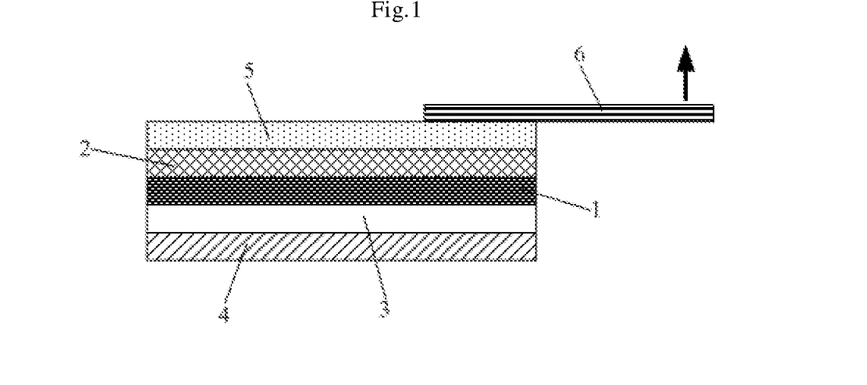
FIG. 1 is a schematic diagram of separating a copper foil from a graphene thin film in a first embodiment of the present invention.
Figure 2:
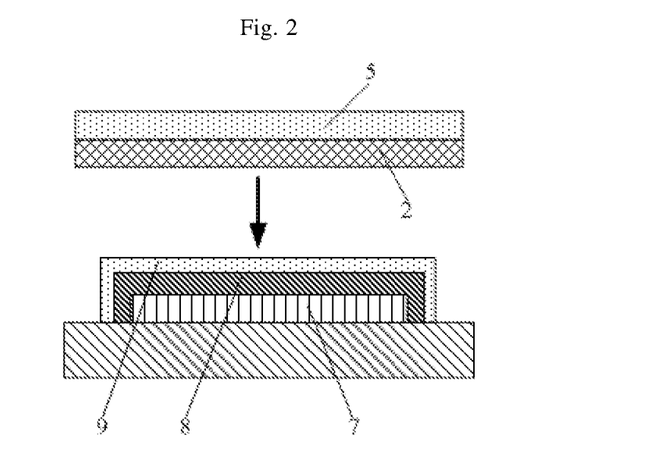
FIG. 2 is a schematic diagram of packaging an OLED device using the graphene thin film in the first embodiment of the present invention.

In the present embodiment, referring to FIGS. 1 and 2, the method for separating a graphene thin film formed on a copper foil from the copper foil and packaging an OLED device using the graphene thin film includes the following Steps S10 to S14.

In Step S10, a surface of the copper foil 1 on which no graphene thin film 2 is formed is adhered onto a fixing substrate 4 by a double-sided adhesive 3.

The fixed substrate 4 is usually made of glass, quartz or silicon wafer material, that is, the fixing substrate 4 is usually a hard substrate, such that the copper foil 1 is stably fixed. The fixing substrate 4 is at a fixed position. This step is for fixing the copper foil 1 whose surface is formed thereon with the graphene thin film 2, such that the graphene thin film 2 and the copper foil 1 can be separated subsequently.

In Step S11, a viscous polymer 5 is processed into a fluid state and poured onto a surface of the copper foil 1 on which the graphene thin film 2 is formed.

In this step, the viscous polymer 5 is processed into a fluid state by employing a melting method. Compared with a processing method in which the viscous polymer 5 is dissolved in a solvent, adverse consequences resulting from incomplete evaporation of the solvent in a curing process of the viscous polymer 5 are prevented.

In Step S12, after being cured, the viscous polymer 5 is glued with an adhesive tape 6, and then a composite film formed of the graphene thin film 2 and the viscous polymer 5 is stripped from the copper foil 1.

Since an adhesive force between the viscous polymer 5 and the graphene thin film 2 is stronger than an adhesive force between the graphene thin film 2 and the copper foil 1, by providing the viscous polymer 5, the graphene thin film 2 and the copper foil 1 can be easily separated. In this step, the graphene thin film 2 can be easily stripped from the copper foil 1 by the adhesive tape 6, so as to facilitate subsequent packaging of an OLED device using the graphene thin film 2.

In Step S13, a passivation layer 8 is formed on an OLED device 7, a transparent adhesive 9 is coated on the passivation layer 8, and before curing the transparent adhesive 9, a surface of the graphene thin film 2 of the composite film is adhered to the transparent adhesive 9.

The passivation layer 8 can isolate electrodes of the OLED device 7 from the graphene thin film 2, thus preliminarily packaging and protecting the OLED device 7. The passivation layer 8 is formed by using low temperature chemical vapor deposition (LEPECVD), room temperature bonding (RTB) or atomic layer deposition (ALD), and a temperature at which the passivation layer 8 is deposited using low temperature chemical vapor deposition is lower than or equal to a critical temperature of heat treatment of the OLED device (which is typically 90° C.). These fabrication methods of the passivation layer 8 are all existing mature fabrication methods, which are not described in detail. The passivation layer 8 is made of an insulating material, such as silicon nitride, silicon dioxide, aluminum oxide, silicon oxynitride or the like. In addition, the viscous polymer 5 in the composite film can serve as a good protection for the graphene thin film 2, and also can serve as a further package of the OLED device 7.

In Step S14, the transparent adhesive 9 is cured.

In this step, a curing temperature of the transparent adhesive 9 is lower than or equal to the critical temperature of heat treatment of the OLED device, thereby preventing a relatively high curing temperature from causing damage to performances of the OLED device 7. Generally, the critical temperature of heat treatment of the OLED device 7 is 90° C., thus, the curing temperature of the transparent adhesive 9 is usually lower than or equal to 90° C. The transparent adhesive 9 is made of the same material as the viscous polymer 5, in view of the relatively strong adhesive force between the viscous polymer 5 and the graphene thin film 2, the transparent adhesive 9 can be firmly adhered to the graphene thin film 2, such that the graphene thin film 2 forms a very good package of the OLED device 7.

So far, packaging of the OLED device 7 using the graphene thin film 2 is completed.

In the present embodiment, a size of the graphene thin film 2 is larger than a size of the OLED device 7, and the graphene thin film 2 is able to entirely cover the OLED device 7, which enables the graphene thin film 2 to package the OLED device 7 very well.

In the present embodiment, the viscous polymer 5 includes any one or a mixture of any combination of polyethylene terephthalate, polydimethylsiloxane, polypropylene, epoxy resin type polyethylene, ABS plastic, polyvinyl chloride, polyformaldehyde, polycarbonate, phenolic plastic, polyurethane plastic, epoxy resin, unsaturated polyester plastic, furan plastic, organic silicon resin, and propylene based resin.

In the packaging method provided by the present embodiment, the graphene thin film 2 on the copper foil 1 is stripped together with the viscous polymer 5 by employing physical stripping method, and then the composite film formed of the graphene thin film 2 and the viscous polymer 5 is adhered to the passivation layer 8 on the OLED device 7 by the transparent adhesive 9, thereby finishing the packaging of the OLED device 7. The packaging method has a simple process, is very convenient to operate, and can improve production efficiency. It is to be noted that, when packaging the OLED device 7 using the composite film formed of the graphene thin film 2 and the viscous polymer 5, the composite film may become out of flatness after covering the OLED device 7 due to inappropriate operation. In addition, when sizes of the base substrate and the OLED device 7 are increased, since a required size of the graphene thin film 2 also needs to be increased accordingly, difficulty of separating the graphene thin film 2 from the copper foil 1 may be increased.

Second Embodiment

Figure 3:
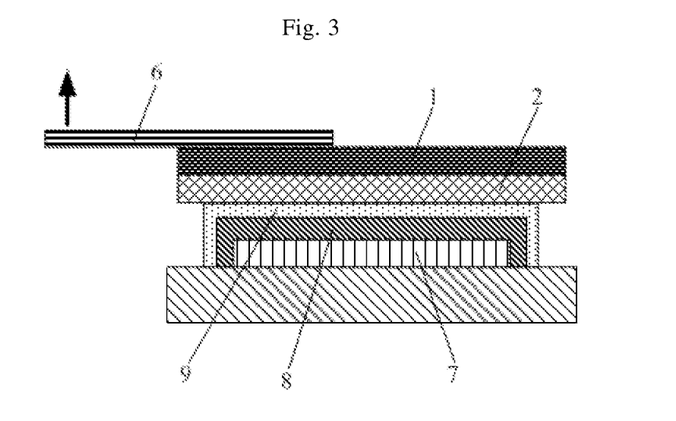
FIG. 3 is a schematic diagram of separating a copper foil from a graphene thin film and packaging an OLED device using the graphene thin film in a second embodiment of the present invention.
Figure 4:
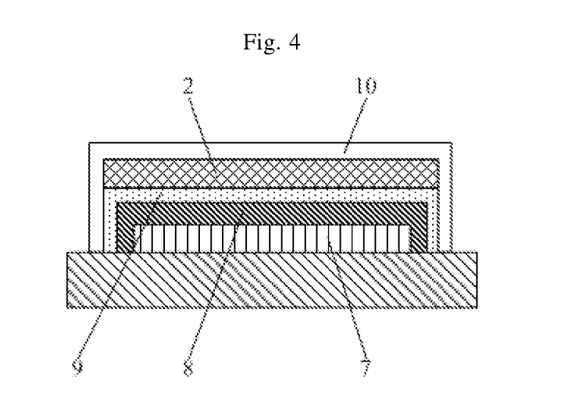
FIG. 4 is a schematic diagram of forming a protective layer on the graphene thin film in the second embodiment of the present invention.

The present embodiment provides a packaging method, referring to FIGS. 3 and 4, the method for separating a graphene thin film formed on a copper foil from the copper foil and packaging an OLED device using the graphene thin film includes the following Steps S20 to S23.

In Step S20, a passivation layer 8 is formed on the OLED device 7, and a transparent adhesive 9 is coated on the passivation layer 8.

A material of the transparent adhesive 9 is the same as that of the first embodiment. A material and a forming method of the passivation layer 8 are the same as those of the first embodiment.

In Step S21, before curing the transparent adhesive 9, a surface of the copper foil 1 on which the graphene thin film 2 is formed is glued to the transparent adhesive 9.

In Step S22, the transparent adhesive 9 is cured.

A curing temperature of the transparent adhesive 9 is the same as that of the first embodiment.

In Step S23, the base substrate, on which the OLED device 7 is formed, subjected to Step S22 is fixed, a surface of the copper foil 1 on which no graphene thin film 2 is formed is glued using an adhesive tape 6, and the copper foil 1 is separated from the graphene thin film 2.

Similarly, a size of the graphene thin film 2 is greater than a size of the OLED device 7.

So far, packaging of the OLED device 7 using the graphene thin film 2 is completed.

It is to be noted that Step S22 and Step S23 are interchangeable, that is, the copper foil 1 may be separated from the graphene thin film 2 first, and then the transparent adhesive 9 may be cured. In this case, it should be assured that in a case where the transparent adhesive 9 is not yet cured, an adhesive force between the graphene thin film 2 and the uncured transparent adhesive 9 is stronger than an adhesive force between the graphene thin film 2 and the copper foil 1, so that the graphene thin film 2 can be easily separated from the copper foil 1.

In the present embodiment, after the copper foil 1 is separated from the graphene thin film 2, the method further includes forming a protection layer 10 on the graphene thin film 2. The protection layer 10 can protect the graphene thin film 2, to prevent the graphene thin film 2 from being damaged, thereby enabling the graphene thin film 2 to package and protect the OLED device 7 well.

The protection layer 10 is formed by using by solution spin coating or chemical vapor deposition. The solution spin coating is a method in which an organic insulating material for forming the protection layer 10 is dissolved in a solvent to form a solution, and then the solution is coated on the graphene thin film 2 to form the protection layer 10. The chemical vapor deposition is a method in which an inorganic insulating material is prepared on the graphene thin film 2 by chemical vapor deposition to form the protection layer 10. In the present embodiment, the protection layer 10 is made of a transparent organic insulating material or a transparent inorganic insulating material.

In the packaging method provided by the present embodiment, first, a surface of the copper foil 1 on which the graphene thin film 2 is formed is adhered to the transparent adhesive 9, and then, the graphene thin film 2 is separated from the copper foil 1, thereby finishing the packaging of the OLED device 7. Compared to the first embodiment, this packaging method has a simpler process, is more convenient to operate, and can further improve production efficiency. Compared to the packaging method of the first embodiment, the packaging method of the present embodiment can greatly reduce the phenomena that the graphene thin film 2 becomes out of flatness after covering the OLED device 7 due to inappropriate operation, and at the same time, can reduce difficulty of separating the graphene thin film 2 from the copper foil 1 in the case of large-sized base substrate and OLED device 7.

Third Embodiment

Figure 5:
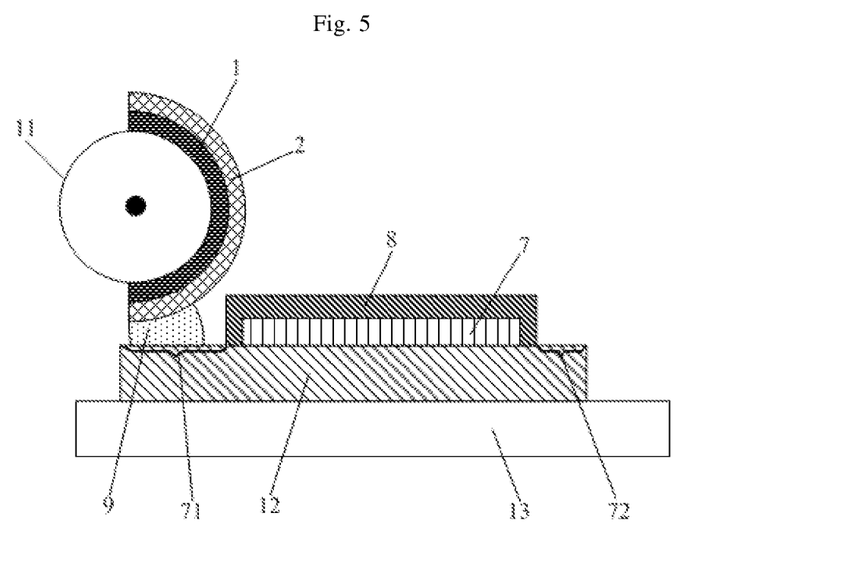
FIG. 5 is a schematic diagram of separating a copper foil from a graphene thin film and packaging an OLED device using the graphene thin film in a third embodiment of the present invention.

The present embodiment provides a packaging method, referring to FIG. 5, the method for separating a graphene thin film formed on a copper foil from the copper foil and packaging an OLED device using the graphene thin film includes the following Steps S30 to S35.

In Step S30, a passivation layer 8 is formed on the OLED device 7.

A material and a forming method of the passivation layer 8 are the same as those of the first embodiment.

In Step S31, a surface of the copper foil 1 on which no graphene thin film 2 is formed is attached to a roller 11 able to be heated.

Inside the roller 11 there is provided a heating device, which can heat an axial surface of the roller 11.

In Step S32, the base substrate 12 subjected to Step S30 is fixed onto a base table 13, with the OLED device 7 facing away from the base table 13.

In this step, the base substrate 12 subjected to Step S30 is fixed onto the base table 13 by an adhering method or a vacuum absorption method, to facilitate subsequent packaging of the OLED device 7.

In Step S33, a transparent adhesive 9 is dripped on a first side 71 of the OLED device 7 on the base substrate 12 such that a side edge of the graphene thin film 2 on the roller 11 corresponds to and contacts with the transparent adhesive 9.

A material of the transparent adhesive 9 is the same as that of the first embodiment.

In Step S34, the roller 11 is heated so that the transparent adhesive 9 is in a incompletely cured state, the roller 11 is rolled to a second side 72 of the OLED device 7 opposite to the first side 71, the transparent adhesive 9 is coated on the passivation layer 8 as dragged by the roller 11, and the passivation layer 8 is adhered to the graphene thin film 2 by the transparent adhesive 9, and at the same time the copper foil 1 is separated from the graphene thin film 2.

In this step, a size of the graphene thin film 2 is greater than a size of the OLED device 7. In the process of rolling the roller 11 from the first side 71 to the second side 72 of the OLED device 7, packaging of the OLED device 7 with the graphene thin film 2 and separation of the copper foil 1 from the graphene thin film 2 can be completed simultaneously, thereby making the packaging of the OLED device 7 more speedy and convenient.

In Step S35, the transparent adhesive 9 is cured.

A curing temperature of the transparent adhesive 9 is the same as that of the first embodiment.

So far, packaging of the OLED device 7 using the graphene thin film 2 is completed.

In the present embodiment, after the copper foil 1 is separated from the graphene thin film 2, the method further includes forming a protection layer on the graphene thin film 2. The protection layer can provide protection to the graphene thin film 2, to prevent the graphene thin film 2 from being damaged, thereby enabling the graphene thin film 2 to package and protect the OLED device 7 well. A material and a forming method of the protection layer are the same as those of the second embodiment.

In the packaging method provided by the present embodiment, the packaging of the OLED device 7 with the graphene thin film 2 and the separation of the copper foil 1 from the graphene thin film 2 can be completed simultaneously in a single step, thereby making the packaging of the OLED device 7 more speedy and convenient. Compared to the packaging method of the first or second embodiment, the packaging method of the present embodiment can prevent the phenomena that the graphene thin film 2 becomes out of flatness after covering the OLED device 7, and the packaging method of the present embodiment can further reduce difficulty of separating the graphene thin film 2 from the copper foil 1.

In addition, the packaging method of the present embodiment is not limited by sizes of the base substrate 12 and the OLED device 7, that is, no matter how large the sizes of the base substrate 12 and the OLED device 7 are, packaging of the OLED device 7 can still be realized by rolling the roller 11 across a corresponding area, as long as the size of the graphene thin film 2 is larger than the size of the OLED device 7 so as to completely cover the OLED device 7.

In the packaging methods provided by the first through third embodiments of the present invention, a graphene thin film is introduced to packaging of an OLED device by separating a graphene thin film formed on a copper foil from the copper foil and packaging the OLED device using the graphene thin film, so that characteristics such as high transmittance, ultra-thinness, flexibility, high water and oxygen resistance, and ease of transfer between substrates (i.e. ease of separation from a copper foil and connection to an OLED device) of the graphene thin film can be sufficiently utilized, thereby not only improving packaging effect of the OLED device, but also simplifying packaging process of the OLED device and increasing production efficiency.

Fourth Embodiment

The present embodiment provides an OLED device, which is packaged using the packaging method of any one of the first through third embodiments.

The OLED device packaged using the packaging method of any one of the first through third embodiments has more excellent packaging effect, such that quality and lifespan of the OLED device can be increased.

Fifth Embodiment

The present embodiment provides a packaging apparatus for packaging an OLED device formed on a base substrate, and the packaging apparatus includes a packaging mechanism for separating a graphene thin film formed on a copper foil from the copper foil and packaging the OLED device using the graphene thin film.

By providing the packaging mechanism, speedy and convenient separation of the graphene thin film from the copper foil can be realized, and in the meanwhile the OLED device can be packaged by the graphene thin film, thereby not only improving packaging effect of the OLED device, but also simplifying packaging process of the OLED device and increasing production efficiency.

Figure 6:
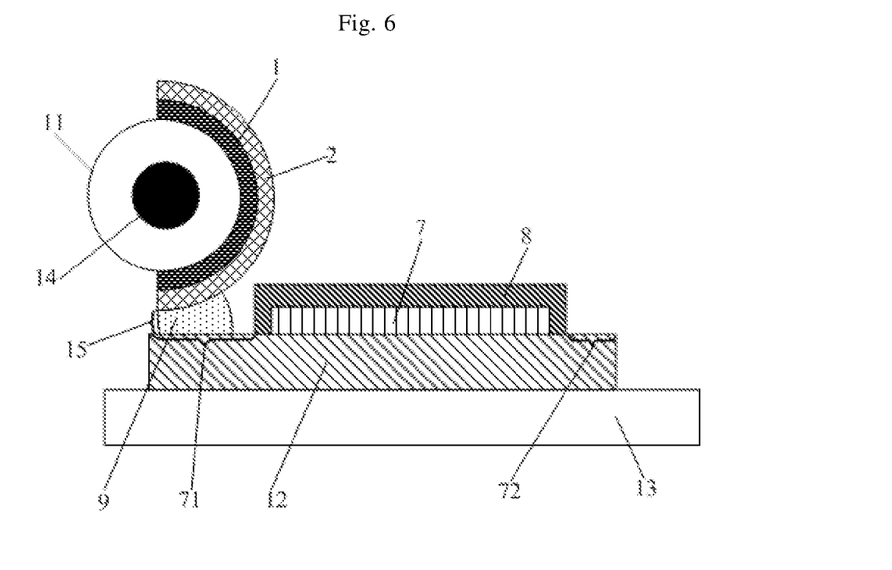
FIG. 6 is a structural schematic diagram of a packaging apparatus for packaging an OLED device in a fifth embodiment of the present invention.

As shown in FIG. 6, the packaging apparatus further includes a base table 13 for supporting the base substrate 12 and the OLED device 7, and the base substrate 12 is attached onto a supporting surface of the base table 13. The packaging mechanism includes a cylindrical roller 11, a driving part (not shown in FIG. 6) and a heating part 14, a cylindrical surface of the roller 11 is used for attaching the copper foil 1 on which the graphene thin film 2 is formed, and a surface of the copper foil 1 on which no graphene thin film 2 is formed is attached to the cylindrical surface of the roller 11.

The roller 11 is provided above the base table 13, and a starting position for rolling the roller 11 corresponds to a first side 71 of the OLED device 7 on the base substrate 12, a gap 15 used for accommodating a transparent adhesive 9 is formed between the roller 11 and the base substrate 12.

The heating part 14 is provided inside the roller 11, and is used for heating the cylindrical surface of the roller 11, such that the transparent adhesive 9 is in an incompletely cured state. The driving part is connected to an end part of the roller 11, and is used for driving the roller 11 to roll to a second side 72 of the OLED device 7 opposite to the first side 71, and the rolling roller 11 can drag the transparent adhesive 9 to extend along the rolling direction of the roller 11.

With such configuration, the packaging apparatus can package the OLED device 7 according to the packaging method of the third embodiment, thereby greatly simplifying packaging process of the OLED device and increasing production efficiency.

In the present embodiment, an axial direction of the roller 11 is parallel to a side edge of the base substrate 12 corresponding to the first side 71 of the OLED device 7, and a length of the roller 11 is greater than or equal to that of the side edge of the base substrate 12. With such configuration, the entire OLED device 7 can be completely covered after rolling the roller 11 across the entire base substrate 12, thereby achieving good packaging of the OLED device 7.

In the packaging apparatus of the present embodiment, by providing the packaging mechanism, speedy and convenient separation of the graphene thin film from the copper foil can be realized, and meanwhile the OLED device can be packaged by the graphene thin film, thereby not only improving packaging effect of the OLED device, but also simplifying packaging process of the OLED device and increasing production efficiency.

It can be understood that the foregoing implementations are merely exemplary implementations used for describing the principle of the present invention, but the present invention is not limited thereto. Those of ordinary skill in the art may make various variations and modifications without departing from the spirit and essence of the present invention, and these variations and modifications shall fall within the protection scope of the present invention.

What is claimed is:

1. A packaging method for packaging an OLED device formed on a base substrate, comprising: separating a graphene thin film formed on a copper foil from the copper foil; and packaging the OLED device using the graphene thin film, wherein separating the graphene thin film formed on the copper foil from the copper foil comprises:

step S10: adhering a surface of the copper foil on which no graphene thin film is formed to a fixing substrate by a double-sided adhesive;

step S11: processing a viscous polymer into a fluid state and pouring the fluid state viscous polymer onto a surface of the copper foil on which the graphene thin film is formed;

step S12: gluing the viscous polymer with an adhesive tape after curing the viscous polymer, and then stripping a composite film formed of the graphene thin film and the viscous polymer from the copper foil;

step S13: forming a passivation layer on the OLED device, coating a transparent adhesive on the passivation layer, and adhering a surface of the graphene thin film of the composite film to the transparent adhesive before curing the transparent adhesive; and step S14: curing the transparent adhesive.

2. The packaging method of claim 1, wherein the viscous polymer is processed into a fluid state by employing a melting method in the step S11.

3. The packaging method of claim 1, wherein the passivation layer is formed by using low temperature chemical vapor deposition, atomic layer deposition or room temperature bonding; a temperature at which the passivation layer is deposited by using the low temperature chemical vapor deposition is lower than or equal to a critical temperature of heat treatment of the OLED device; the passivation layer is made of silicon nitride, silicon dioxide, aluminum oxide, or silicon oxynitride.

4. An OLED device, packaged by using the packaging method of claim 1.

5. A packaging method, comprising:
forming a passivation layer on an OLED device formed on a base substrate, and coating a transparent adhesive on the passivation layer;
adhering a surface of a copper foil on which a graphene thin film is formed to the transparent adhesive before curing the transparent adhesive;
curing the transparent adhesive; and
fixing the base substrate, gluing a surface of the copper foil on which no graphene thin film is formed by using an adhesive tape, and separating the copper foil from the graphene thin film.

6. The packaging method of claim 5, further comprising forming a protection layer on the graphene thin film after separating the copper foil from the graphene thin film.

7. The packaging method of claim 6, wherein the protection layer is formed by using solution spin coating or chemical vapor deposition; the protection layer is made of a transparent organic insulating material or a transparent inorganic insulating material.

8. The packaging method of claim 1, wherein the fixing substrate is made of glass, quartz or silicon wafer material.

9. The packaging method of claim 1, wherein a size of the graphene thin film is greater than a size of the OLED device, and the graphene thin film entirely covers the OLED device.

10. The packaging method of claim 1, wherein the transparent adhesive is made of the same material as the viscous polymer; the viscous polymer comprises any one or more of polyethylene terephthalate, polydimethylsiloxane, polypropylene, epoxy resin type polyethylene, ABS plastic, polyvinyl chloride, polyformaldehyde, polycarbonate, phenolic plastic, polyurethane plastic, epoxy resin, unsaturated polyester plastic, furan plastic, organic silicon resin, and propylene based resin.

11. The packaging method of claim 1, wherein a curing temperature of the transparent adhesive is lower than or equal to a critical temperature of heat treatment of the OLED device.

12. The packaging method of claim 5, wherein a size of the graphene thin film is greater than a size of the OLED device, and the graphene thin film entirely covers the OLED device.

13. A packaging method, comprising:
forming a passivation layer on an OLED device formed on a base substrate;
attaching a surface of a copper foil on which no graphene thin film is formed to a roller able to be heated;
fixing the base substrate onto a base table, with the OLED device facing away from the base table;
dripping a transparent adhesive on a first side of the OLED device on the base substrate such that a side edge of the graphene thin film on the roller corresponds to and contacts with the transparent adhesive;
heating the roller to cause the transparent adhesive to be in an incompletely cured state, rolling the roller to a second side of the OLED device opposite to the first side, so that the transparent adhesive is coated on the passivation layer after being dragged by the roller, the passivation layer is adhered to the graphene thin film by the transparent adhesive, and meanwhile the copper foil is separated from the graphene thin film; and
curing the transparent adhesive.

14. The packaging method of claim 13, wherein the base substrate is fixed onto the base table by an adhering method or a vacuum absorption method when fixing the base substrate onto the base table.

15. The packaging method of claim 13, wherein a size of the graphene thin film is greater than a size of the OLED device, and the graphene thin film entirely covers the OLED device.

16. The packaging method of claim 13, further comprising forming a protection layer on the graphene thin film after separating the copper foil from the graphene thin film.

17. A packaging apparatus for packaging an OLED device formed on a base substrate, comprising a packaging mechanism for separating a graphene thin film formed on a copper foil from the copper foil and packaging the OLED device using the graphene thin film,
wherein the packaging mechanism is configured to:
adhere a surface of the copper foil on which no graphene thin film is formed to a fixing substrate by a double-sided adhesive;
process a viscous polymer into a fluid state and pour the fluid state viscous polymer onto a surface of the copper foil on which the graphene thin film is formed;
glue the viscous polymer with an adhesive tape after curing the viscous polymer, and then strip a composite film formed of the graphene thin film and the viscous polymer from the copper foil;
form a passivation layer on the OLED device, coat a transparent adhesive on the passivation layer, and adhere a surface of the graphene thin film of the composite film to the transparent adhesive before curing the transparent adhesive; and
cure the transparent adhesive.

18. The packaging apparatus of claim 17, further comprising a base table, wherein
the base table is used for supporting the base substrate and the OLED device, and the base substrate is attached onto a supporting surface of the base table;
the packaging mechanism comprises a cylindrical roller, a driving part and a heating part, a cylindrical surface of the roller is used for attaching the copper foil on which the graphene thin film is formed, and the surface of the copper foil on which no graphene thin film is formed is attached to the cylindrical surface of the roller;
the roller is provided above the base table, and a starting position for rolling the roller corresponds to a first side of the OLED device on the base substrate, a gap for accommodating a transparent adhesive is formed between the roller and the base substrate, the transparent adhesive comprises the viscous polymer;
the heating part is provided inside the roller, and is used for heating the cylindrical surface of the roller to cause the transparent adhesive to be in an incompletely cured state; and
the driving part is connected to an end part of the roller, and is used for driving the roller to roll to a second side of the OLED device opposite to the first side, and the rolling roller is able to drag the transparent adhesive to extend along the rolling direction of the roller.

19. The packaging apparatus of claim 18, wherein an axial direction of the roller is parallel to a side edge of the base substrate corresponding to the first side of the OLED device, and a length of the roller is greater than or equal to that of the side edge of the base substrate.

* * * * *